United States Patent [19]
Shou et al.

[11] Patent Number: 5,319,317
[45] Date of Patent: Jun. 7, 1994

[54] VOLTAGE FOLLOWER CIRCUIT

[75] Inventors: Guoliang Shou; Weikang Yang; Wiwat Wongwarawipat; Sunao Takatori; Makoto Yamamoto, all of Tokyo, Japan

[73] Assignee: Yozan, Inc., Tokyo, Japan

[21] Appl. No.: 986,809

[22] Filed: Dec. 8, 1992

[30] Foreign Application Priority Data

Sep. 18, 1992 [JP] Japan .................................. 4-275217

[51] Int. Cl.[5] .............................................. H03F 3/26
[52] U.S. Cl. ..................................... 330/264; 307/585
[58] Field of Search ................ 330/264; 307/246, 576, 307/585

[56] References Cited

U.S. PATENT DOCUMENTS 4,424,456  1/1984  Shiraki et al. .................. 307/246 X

OTHER PUBLICATIONS

Electronics Handbook, Electronic Society, May 18, 1975, pp. 1703-1704.
Handbook for the Most Use of Analog IC, CQ Publishing Kabushiki Kaisha, Jan. 20, 1992, pp. 135-142.

Primary Examiner—James B. Mullins
Attorney, Agent, or Firm—Cushman, Darby & Cushman

[57] ABSTRACT

A voltage follower circuit comprising an nMOS transistor whose drain is connected to a power source and a pMOS transistor whose drain is connected to the source of the nMOS transistor and whose source is grounded, wherein input voltage is connected to the gates of nMOS and pMOS transistor. A source of the nMOS transistor is connected to an output terminal, and the output terminal is grounded through capacitance.

4 Claims, 4 Drawing Sheets

VOLTAGE FOLLOWER CIRCUIT

FIELD OF THE INVENTION

The present invention relates to a voltage follower circuit.

BACKGROUND OF THE INVENTION

A voltage follower circuit is conventionally known as a buffer amplifier. The conventional circuit, shown in FIG. 1, maintains the output voltage level by grounding the source of a MOSFET transistor through resistor R1. When the value of R1 is small, the level of the output voltage is lowered. When the value of R1 is large, the output voltage Vout follows the input poorly because of the increase of the time constant associated with parasitic capacitance C1.

SUMMARY OF THE INVENTION

The present invention solves the above conventional problems and has an object of providing a responsive voltage follower circuit without leaking the necessary output voltage level.

The voltage follower circuit according to the present invention uses CMOS technology. The drain of a nMOS transistor is connected to a power source. The source of a pMOS transistor is connected to a lower voltage. The source of the nMOS transistor is connected to the drain of the pMOS transistor. Input voltage is inserted into the nMOS and pMOS transistors at their gates. The drain of the pMOS transistor is connected to the output terminal. Therefore, the output voltage is preserved by the resistance between source and drain of pMOS transistor in a non-conductive condition. Furthermore, a high responsive performance is realized by discharging parasitic capacitance caused by conduction of the pMOS transistor.

"T1" is a MOSFET transistor, "R1" is a resister, "C1" and "C2" are parasitic capacitances, "Vout" is an output voltage, "T2" is an nMOS transistor, "T3" and "T4" are pMOS transistors, "Vcc" is a power source, "Vin" is an input voltage, "V'out" is the change in the output voltage, "-Vcc" is a minus power source, "Iin" is an input current, and "Iout" is an output current.

PREFERRED EMBODIMENT OF THE INVENTION

Hereinafter, the first embodiment of the voltage follower circuit relating to the present invention is described with reference to the attached drawings.

Figure 2:
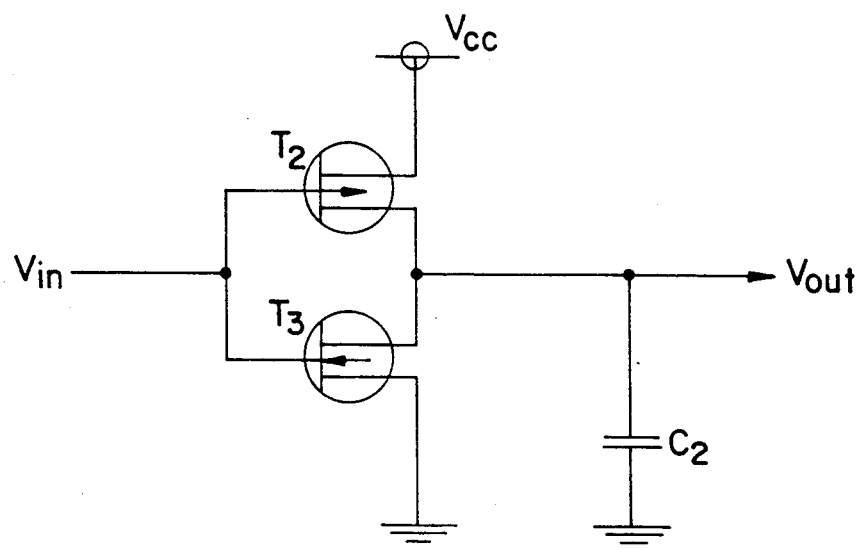
FIG. 2 shows a circuit of the first embodiment.

In FIG. 2, the voltage follower circuit uses CMOS technology comprised of an nMOS transistor (hereafter "T2") and a pMOS transistor (hereafter "T3"). The drain of T2 is connected to power source Vcc. The source of T3 is grounded and the source of T2 is connected to the drain of T3. Input voltage Vin is connected to the gates of T2 and T3. An output terminal is connected to the drain of T3.

Figure 1:
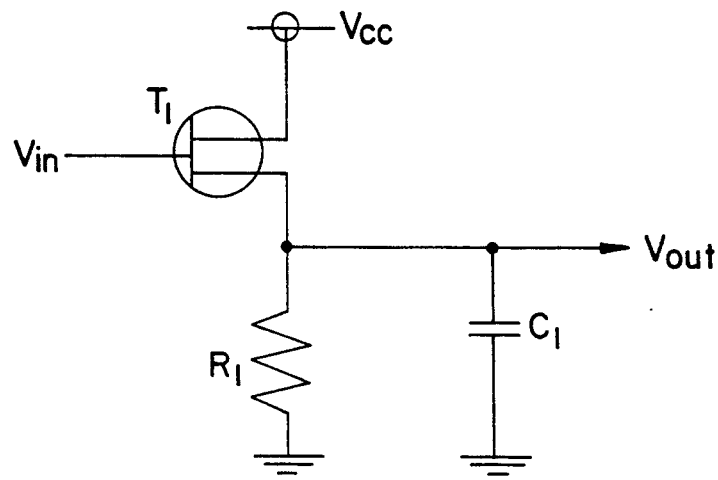
FIG. 1 shows a circuit of a conventional voltage follower circuit.
Figure 3:
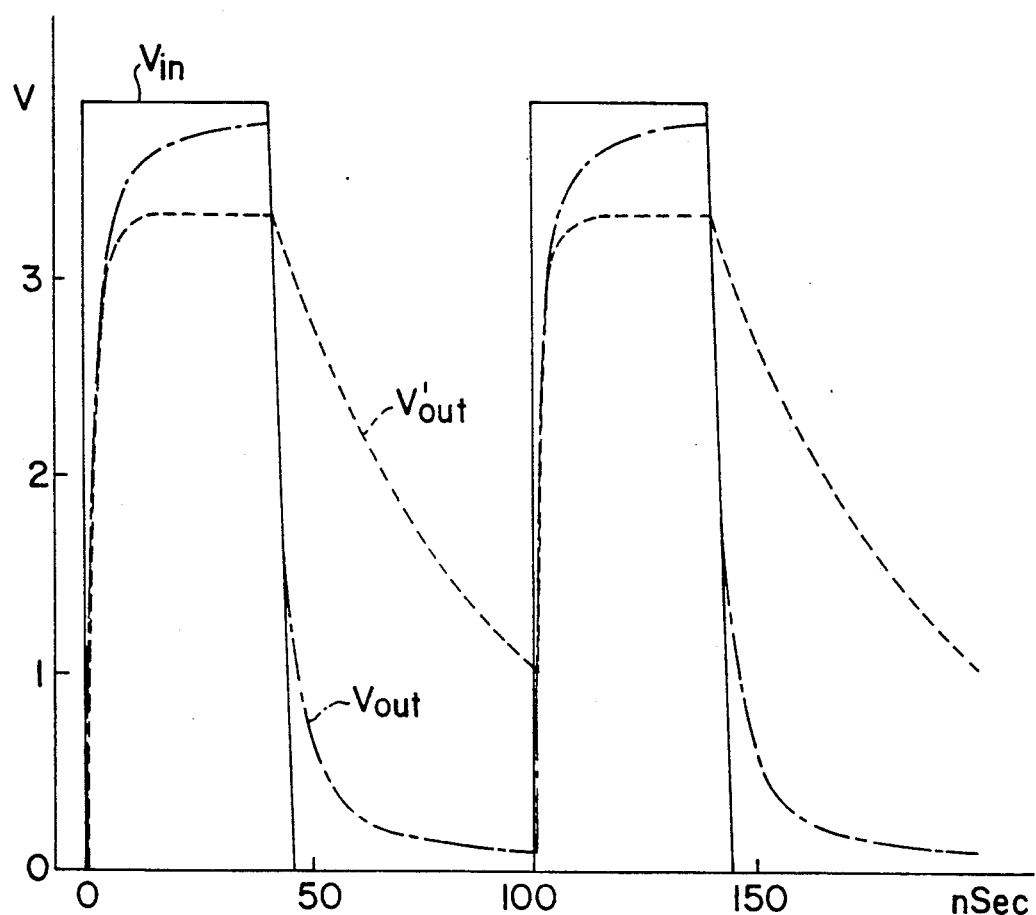
FIG. 3 shows a graph comparing the voltage input and output characteristics of the embodiment in FIG. 2 with a conventional circuit.

As shown in FIG. 3, when input voltage Vin is 0V, the output voltage is also 0V. As the input voltage Vin rises, output voltage Vout also rises. Here, the output voltage level is preserved by the resistance of the pMOS transistor and Vin is almost the same as Vout. As Vin decreases, Vout also decreases. The parasitic capacitance C2 discharges quickly because of the pMOS transistor current. The change of the circuit output voltage is expressed in FIG. 1 by "V'out". The decrease rate V'out is much slower than that of Vout. That is, in this embodiment, the output voltage is satisfactorily responsive.

Figure 4:
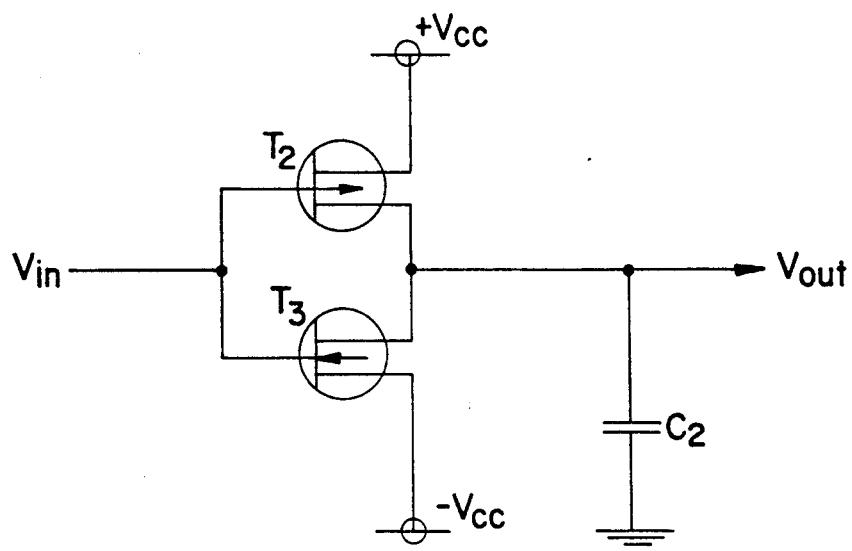
FIG. 4 shows a circuit of the second embodiment.
Figure 5:
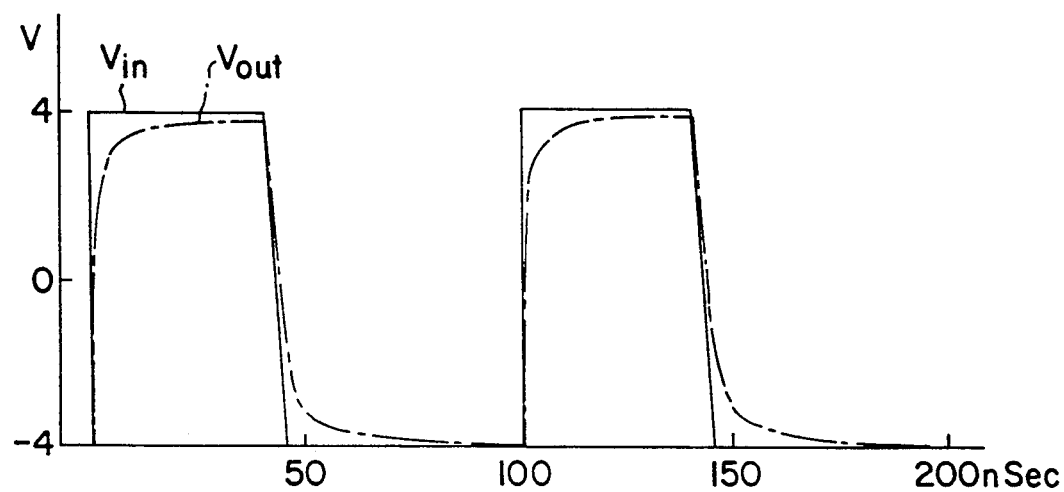
FIG. 5 shows a graph of the input and output voltage characteristics of the embodiment shown in FIG. 4.
Figure 6:
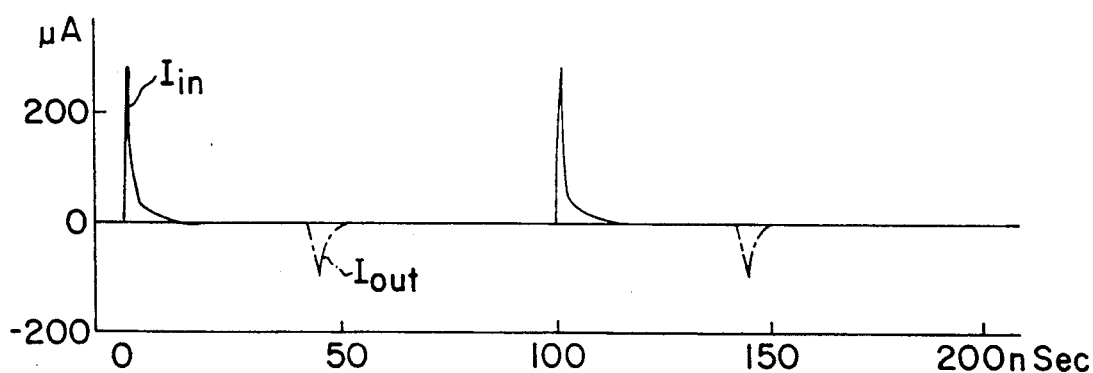
FIG. 6 shows a graph of the input and output current characteristics of the embodiment shown in FIG. 4.

FIG. 4 shows a second embodiment of the present invention. In this second embodiment, the source of the pMOS transistor of the circuit in FIG. 2 is not grounded, instead, it is connected to a minus power source -Vcc. High responsive performance can be realized by such a construction in the same way as shown in FIG. 3. FIG. 5 shows the relationship between Vin and Vout. FIG. 6 shows the change of input current Iin and output current Iout with respect to Vin and Vout in FIG. 5. It is clear from FIG. 5 that the responsive performance produces a good result. The electric current is generated only at the beginning of the change in input and output. Consequently, the circuit consumes a low amount of power. The circuit in FIG. 2 also consumes low power.

Figure 7:
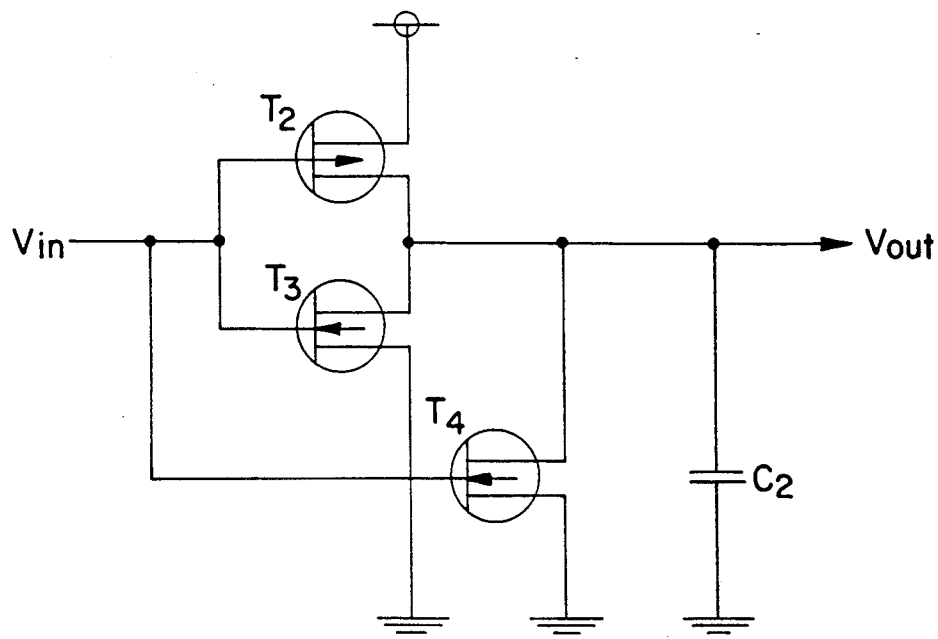
FIG. 7 shows a circuit of the third embodiment.

FIG. 7 shows the third embodiment of the present invention. In this third embodiment, a pMOS transistor (hereafter "T4") is added to the circuit of FIG. 2 parallel to T3. Here, the electric discharge of the parasitic capacitance C2 is much higher.

As mentioned above, the voltage follower circuit, according to the present invention, uses CMOS technology. The circuit connects a power source to the drain of an nMOS transistor, connects the source of a pMOS transistor to a low voltage source, connects the source of the nMOS transistor and the drain of the pMOS transistor together, receives an input voltage at the gates of the nMOS and pMOS transistors, and connects the source of the nMOS transistor to the output terminal. Therefore, the output voltage is preserved by the resistance between source and drain of the pMOS transistor in a non-conductive condition, and parasitic capacitance is discharged by conduction of the pMOS transistor. Consequently, it is possible to realize a responsive circuit preserving the necessary level of output voltage.

What is claimed is:

1. A voltage follower circuit comprising:
    an nMOS transistor having a drain adapted to be connected to a power source;
    a pMOS transistor having a drain connected to a source of said nMOS transistor, and a source adapted to be connected to a voltage lower than that of said power source;
    a gate of each said nMOS transistor and pMOS transistor adapted to be connected to an input voltage;
    an output terminal connected to said source of said nMOS transistor; and
    a capacitance between said output terminal and ground.

2. A voltage follower circuit as in claim 1, wherein said source of said pMOS transistor is adapted to be connected to ground.

3. A voltage follower circuit comprising:
- an nMOS transistor having a drain adapted to be connected to a positive power source;
- a pMOS transistor having a drain connected to a source of said nMOS transistor and having a source adapted to be connected to a negative power source;
- a gate of each said nMOS transistor and pMOS transistor adapted to be connected to an input voltage;
- an output terminal connected to said source of said nMOS transistor; and
- a capacitance between said output terminal and a ground.

4. A voltage follower circuit comprising:
- an nMOS transistor having a drain adapted to be connected to a power source;
- a first pMOS transistor having a drain connected to a source of said nMOS transistor and having a source adapted to be connected to a ground;
- an output terminal connected to said source of said nMOS transistor;
- a capacitance between said output terminal and said ground;
- a second pMOS transistor connected in parallel with said capacitance; and
- a gate of each of said nMOS transistor, said first pMOS transistor and said second pMOS transistor adapted to be connected to an input voltage.

* * * * *